United States Patent
Chen et al.

(10) Patent No.: US 11,917,761 B2
(45) Date of Patent: Feb. 27, 2024

(54) TOMBSTONE PREVENTION FOR A SURFACE MOUNT DEVICE

(71) Applicant: Western Digital Technologies, Inc., San Jose, CA (US)

(72) Inventors: Joyce Chen, Taichung (TW); Lynn Lin, Taichung (TW); Emma Wang, Taichung (TW); Linda Huang, Taiwan (TW); Cong Zhang, Shanghai (CN); Zengyu Zhou, Shanghai (CN); Juan Zhou, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/687,890

(22) Filed: Mar. 7, 2022

(65) Prior Publication Data
US 2023/0284388 A1 Sep. 7, 2023

(51) Int. Cl.
*H05K 1/18* (2006.01)
*H05K 3/34* (2006.01)

(52) U.S. Cl.
CPC ............ *H05K 1/181* (2013.01); *H05K 3/3442* (2013.01); *H05K 3/3452* (2013.01); *H05K 2201/1003* (2013.01); *H05K 2201/10015* (2013.01); *H05K 2201/10022* (2013.01); *H05K 2201/10636* (2013.01)

(58) Field of Classification Search
CPC .................................................... H05K 1/181
USPC ........................................................ 174/260
See application file for complete search history.

(56) References Cited

U.S. PATENT DOCUMENTS

| | | | |
|---|---|---|---|
| 2018/0102217 A1* | 4/2018 | Fukunaga | H01G 4/232 |
| 2019/0318874 A1* | 10/2019 | Orimo | H05K 1/181 |
| 2021/0280374 A1* | 9/2021 | Nishikawa | H01G 4/248 |
| 2022/0301779 A1* | 9/2022 | Take | H01G 4/2325 |

\* cited by examiner

*Primary Examiner* — Stanley Tso
(74) *Attorney, Agent, or Firm* — Armstrong Teasdale LLP (57) ABSTRACT

A surface mount device having features on contacts to prevent the surface mount device from tombstoning. The feature may be channel defined by the contact that helps balance a torque/force applied on each side of the surface mount device during a reflow soldering process. The feature may also be a solder mask that helps balance a torque/force applied on each side of the surface mount device during a reflow soldering process.

20 Claims, 5 Drawing Sheets

TOMBSTONE PREVENTION FOR A SURFACE MOUNT DEVICE

BACKGROUND

Surface mount devices such as inductors, capacitors, and resistors, are often subject to tombstoning. Tombstoning occurs when one end of the surface mount device detaches from a pad of the printed circuit board and stands on the other end during a reflow soldering process. Common causes of tombstoning include an unbalanced torque on each side of the surface mount device due to surface tension of the molten solder and/or by an upward push by solvent vapors from flux during the reflow soldering process. Accordingly, it would be advantageous for surface mount devices to have features that prevent or counteract the factors that cause tombstoning.

SUMMARY

The present application describes features for a surface mount device that prevent the surface mount device from tombstoning during a reflow soldering process. A surface mount device, such as a surface mount capacitor, typically includes a rectangular block of a ceramic dielectric having terminations or contacts on either side. In the examples described herein, a channel or groove is etched or otherwise formed in each of the contacts. The channels or grooves help balance a wetting torque/force on each side of the surface mount device and/or help prevent an upward push of solvent vapors from flux during the reflow soldering process. In another example, a solder mask may be provided on an upper portion of each contact of the surface mount device. The solder mask changes a roughness of an outer surface of the contact thereby preventing the solder from climbing the side of the contact during the reflow soldering process. As a result, a wetting force applied on each side of the surface mount device remains balanced or substantially balanced.

Accordingly, the present application describes a surface mount device for a printed circuit board. The surface mount device includes a first contact provided on a first side of the surface mount device and a second contact provided on a second side of the surface mount device. A first channel is defined by the first contact. The first channel extends along a width of the first side of the surface mount device. The surface mount device also includes a second channel defined by the second contact. The second channel extends along a width of the second side of the surface mount device. The first channel and the second channel prevent at least one of the first side of the surface mount device and the second side of the surface mount device from lifting off of the printed circuit board during a reflow soldering process.

Also described is a surface mount device for a printed circuit board. The surface mount device includes a first contact and a second contact. A first channel defined by the first contact, extends horizontally on the first contact. A second channel defined by the second contact extends horizontally on the second contact. In an example, the first channel and the second channel prevent at least one side of the surface mount device from lifting off of the printed circuit board during a reflow soldering process.

The present application also describes a surface mount device for a printed circuit board. The surface mount device includes a first contact associated and a second contact. A first portion of the first contact includes a first feature and a first portion of the second contact includes a second feature. At least one of the first feature and the second feature maintain a balance between a first torque provided on the first contact and a second torque provided on the second contact during a reflow soldering process.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

As indicated above, tomb stoning (also referred to as the tombstone effect, the Manhattan effect, drawbridging, etc.) is a defect in a reflow soldering process in which one side of a surface mount device lifts off of a pad or other surface of a printed circuit board during a reflow soldering process. Tombstoning occurs as a result of unbalanced wetting torque/force on the sides of the surface mount device and/or upward push on the surface mount device caused by solvent vapors from flux during the reflow soldering process.

In order to address tombstoning, the present application describes features that may be provided on a surface mount device to prevent the surface mount device from tombstoning during a reflow soldering process. In an example, the features may be added to the surface mount device during a manufacturing process.

As will be explained in greater detail below, in one example, the feature of the surface mount device is a channel or groove defined by contacts on opposing sides of the surface mount device. The channel helps maintain a balance between a wetting force on each side of the surface mount device during the reflow soldering process. In another example, the feature is a solder mask. The solder mask changes the roughness of a surface of the contact on which it is placed, thereby preventing or reducing an upward flux force of the solder during the reflow soldering process.

These various benefits and examples will be described in greater detail below with reference to FIG. 1-FIG. 5.

Figure 1:
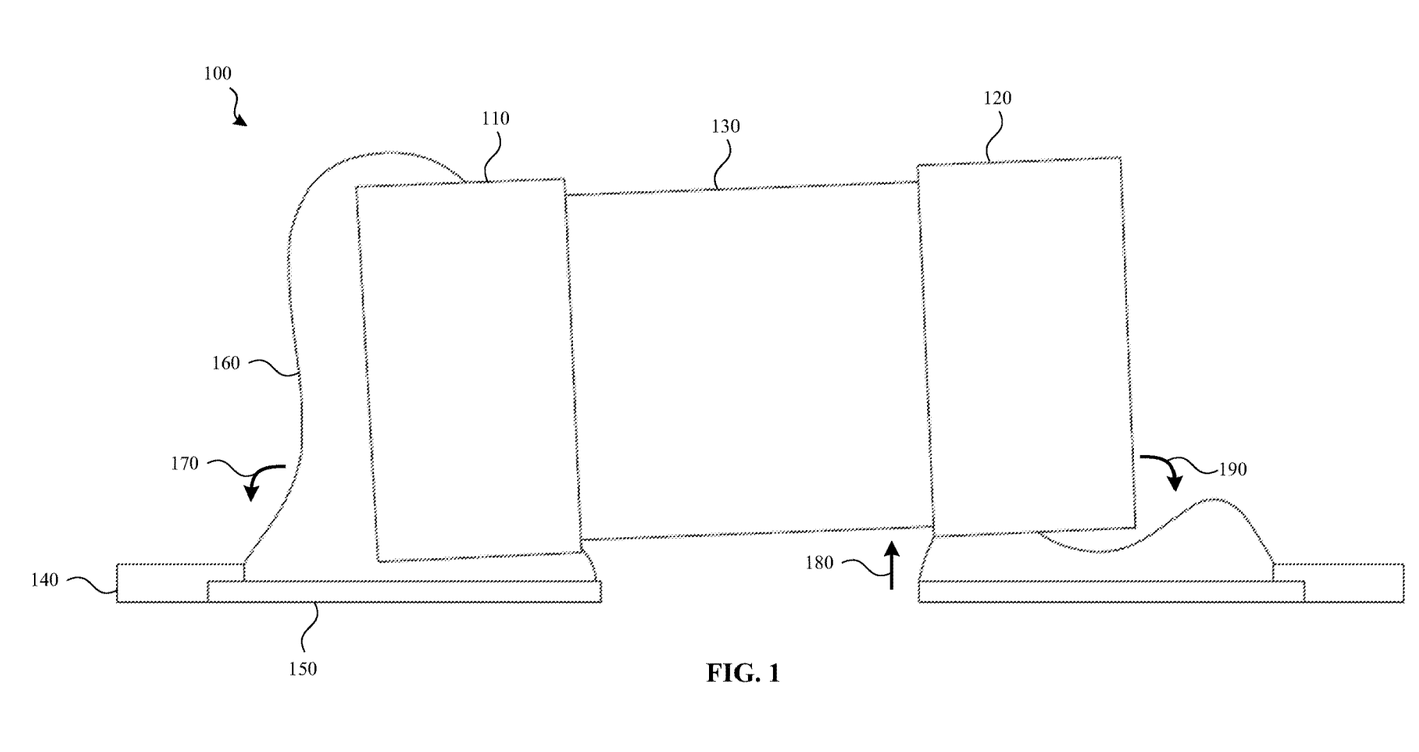
FIG. 1 illustrates tombstoning of a surface mount device according to an example.

FIG. 1 illustrates tombstoning of a surface mount device 100 according to an example. The surface mount device 100 may be a capacitor, an inductor, a resistor or the like. The surface mount device 100 includes a first contact 110 and a second contact 120. The first contact 110 and the second contact 120 are provided on opposite ends of a dielectric 130. In an example, the dielectric 130 is ceramic although other materials may be used.

The surface mount device 100 is typically rectangular and ranges in size from approximately 7.4 mm×5.1 mm to approximately 0.4 mm×0.2 mm. Although specific shapes and dimensions have been given, a surface mount device 100 may have any shape and/or size. However, the smaller and/or lighter the surface mount device 100, the greater chance that the surface mount device 100 will tombstone during a reflow soldering process.

In the example shown in FIG. 1, the surface mount device 100 is placed on a pad 150 of a printed circuit board 140. Solder 160 may be provided on the pad 150. During a reflow soldering process, a first torque generated by a wetting force associated with the solder may be applied on a first side of the surface mount device 100 and/or a second torque generated by a wetting force associated with the solder 160 may be applied on a second side of the surface mount device 100. If the torque (represented by arrow 170) of a wetting force on the first side of the surface mount device 100 exceeds the torque (represented by arrow 190) of the wetting force on the second side of the surface mount device, the second side of the surface mount device 100 lifts off of the pad 150 and/or the printed circuit board 140 such as shown in FIG. 1. This is shown in FIG. 1 by the solder 160 climbing up the side of the first contact 110 thereby causing the second contact 120 to lift off of the printed circuit board 140 and/or the pad 150. Solvent vapors from flux (represented by the arrow 180) may also push the one end of the surface mount device 100 in an upward direction.

Figure 2:
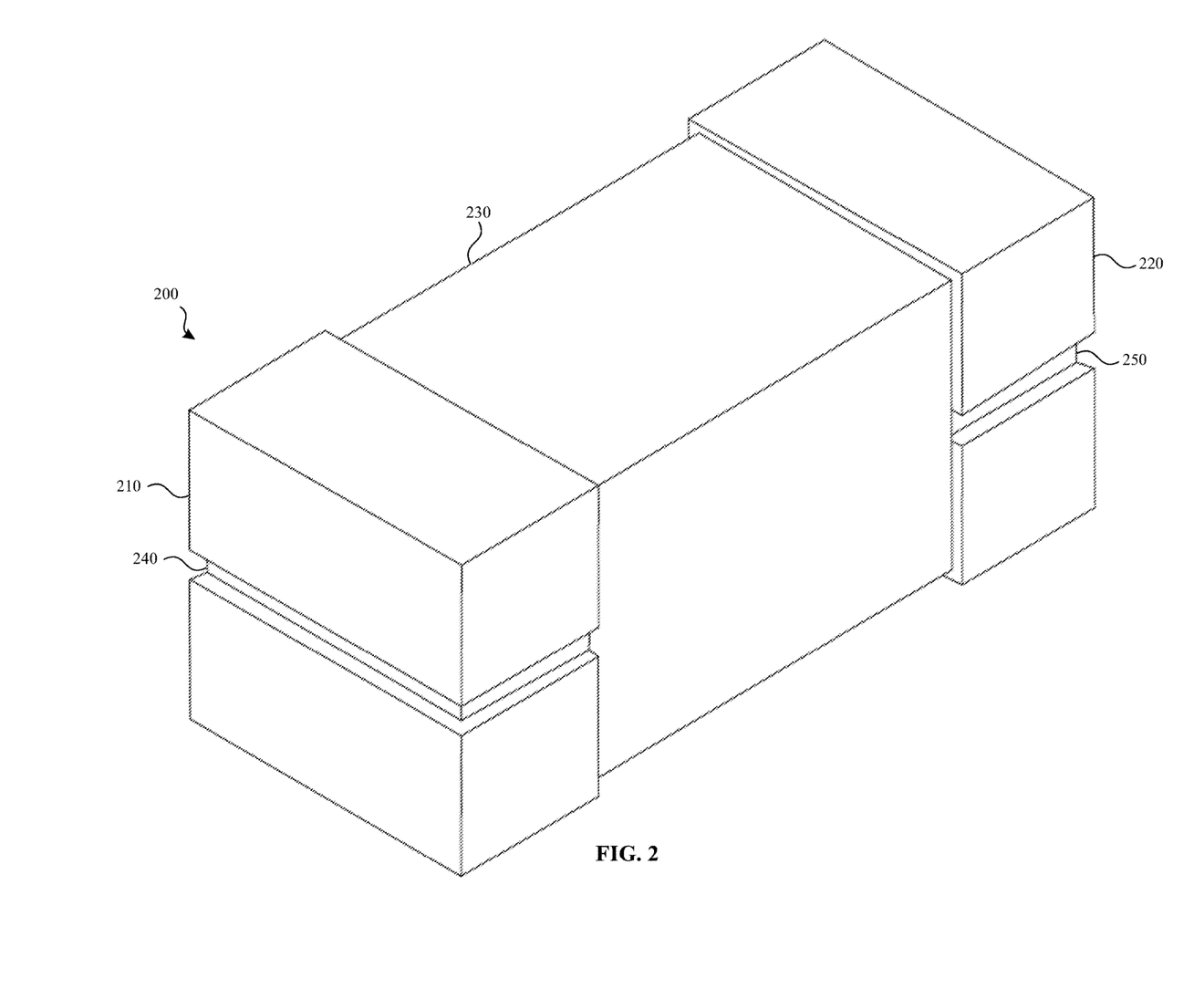
FIG. 2 illustrates a surface mount device having a first channel defined by a first contact and a second channel defined by a second contact according to an example.

FIG. 2 illustrates a surface mount device 200 having a first channel 240 defined by a first contact 210 and a second channel 250 defined by a second contact 220 according to an example. The surface mount device 200 may be similar to the surface mount device 100 shown and described with respect to FIG. 1. For example, the surface mount device 200 includes a first contact 210 on a first side of a dialectic 230 and a second contact 220 on a second side of the dialectic 230. However, unlike the surface mount device 100 of FIG. 1, the channels or grooves defined by the contacts of the surface mount device 200 cause the surface mount device 200 to be less susceptible to tombstoning.

As shown in FIG. 2, the first contact 210 defines a first channel 240 or groove. Likewise, the second contact 220 defines a second channel 250 or groove. In an example, the first channel 240 and the second channel 250 have a depth of approximately ten micrometers and a width of approximately thirty micrometers. Although specific measurements have been given, other depths and widths may be used.

Each of the first channel 240 and the second channel 250 may be positioned approximately in the center, middle or midpoint of the first contact 210 and the second contact 220 respectively. In other examples, each of the first channel 240 and the second channel 250 may be provided at any location on the first contact 210 and the second contact 220 respectively. Additionally, although FIG. 2 shows a single channel on each of the first contact 210 and the second contact 220, each contact may have multiple channels positioned at any number of locations/positions.

The first channel 240 and the second channel 250 may be square such as shown in FIG. 2. In other examples, each of the first channel 240 and the second channel 250 may be rectangular, circular or have any other shape.

The first channel 240 extends horizontally, or substantially horizontally along a width of an outer side surface of the first contact 210. The first channel 240 may also extend to a front outer surface of the first contact 210 and/or a back outer surface of the first contact 210. The first channel 240 may be a continuous channel along the back, side, and front surfaces. In another example, the first channel 240 may be divided into various smaller channels along each surface.

Likewise, the second channel 250 extends horizontally, or substantially horizontally, along a width of an outer side surface of the second contact 220. The second channel 250 may also extend to a front outer surface of the second contact 220 and/or to a back outer surface of the second contact 220. The second channel 250 may be a continuous channel along the back, side, and front outer surfaces. In another example, the second channel 250 may be divided into various smaller channels along each surface.

Each of the first channel 240 and/or the second channel 250 may be etched, carved, cut or otherwise provided on their respective contacts during a manufacturing process. In one example, the channels may be provided on a contact when the contact is formed, such as, for example, during a plating process. In another example, the channel may be formed on the contact after a plating process has occurred. In yet another example, the channel may be formed on the contact prior to, or as part of, a surface mount device placement process.

Figure 3:
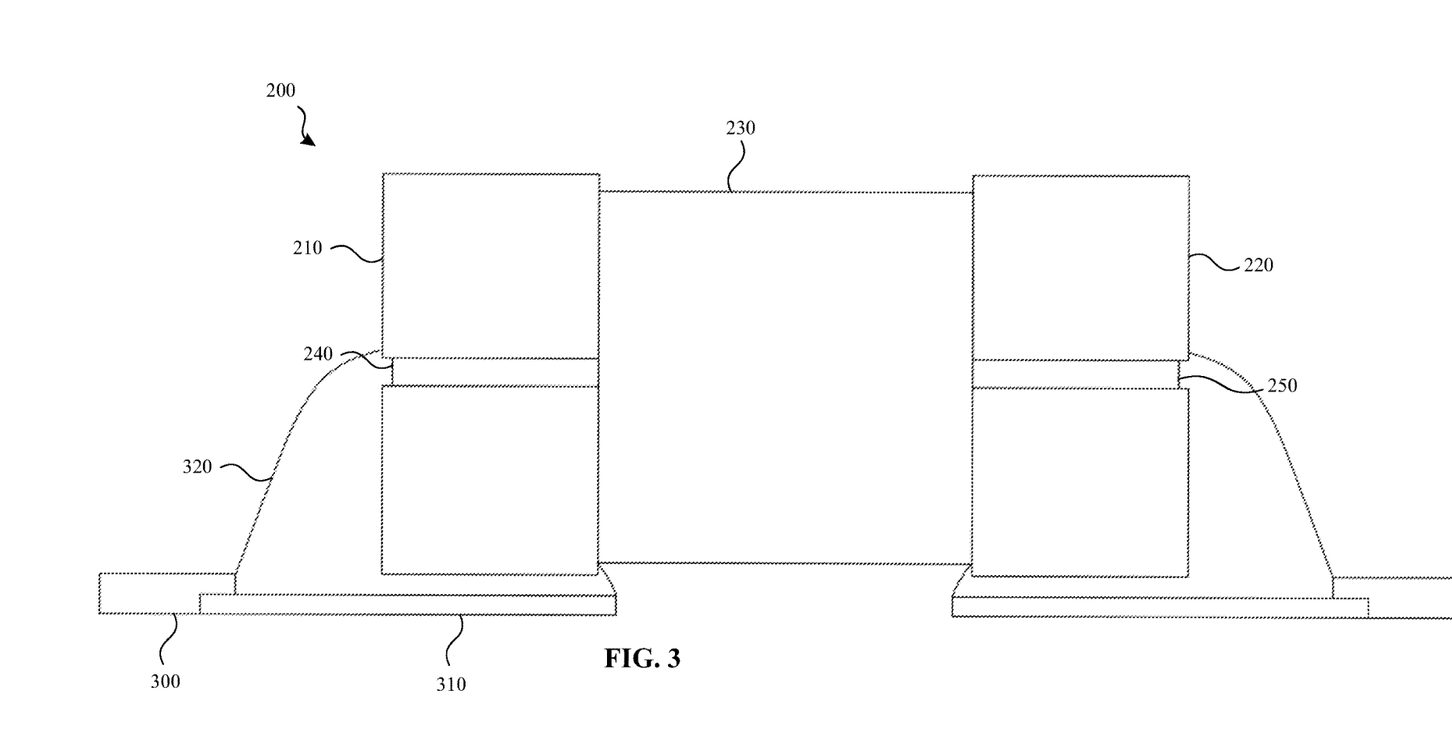
FIG. 3 illustrates how the first channel on the first contact and the second channel on the second contact prevent the surface mount device of FIG. 2 from tomb stoning like the surface mount device shown in FIG. 1 according to an example.

FIG. 3 illustrates how the first channel 240 on the first contact 210 and the second channel 250 on the second contact 220 prevent the surface mount device 200 of FIG. 2 from tombstoning like the surface mount device 100 shown in FIG. 1 according to an example.

In the example shown in FIG. 3, the surface mount device 200 may be placed on a pad 310 of a printed circuit board 300. The pad 310 may include solder paste 320. During a reflow soldering process, the first channel 240 and/or the second channel 250 help maintain a balance between a torque and/or surface tension applied to the first contact 210 with a torque and/or surface tension applied to the second contact 220 due to a wetting force associated with a reflow soldering process. Balancing or maintaining the balance of the torque on the first contact 210 and the second contact 220 helps prevent the first side of the of the surface mount device 200 (e.g., the side of the surface mount device 200 having the first contact 210) from lifting off of the pad 310 and/or the printed circuit board 300 and/or helps prevent the second side of the of the surface mount device 200 (e.g., the side of the surface mount device 200 having the second contact 220) from lifting off of the pad 310 and/or the printed circuit board 300.

In some examples, as the solder 320 moves up the side of the first contact 210 and/or the second contact 220 during the reflow soldering process, the first channel 240 and/or the second channel 250 receives some of the solder and prevents the solder from climbing further up the side. Thus, even if the solder on different sides of the surface mount device 200 undergo a wetting process at different times, the first channel 240 and/or the second channel 250 prevent an upward movement or push (e.g., caused by solvent vapors from flux) of the solder 320. Since the solder 320 is prevented from moving up the side of the contact, the torque on each side of the surface mount device 200 may remain substantially balanced until the reflow soldering process is complete.

Figure 4:
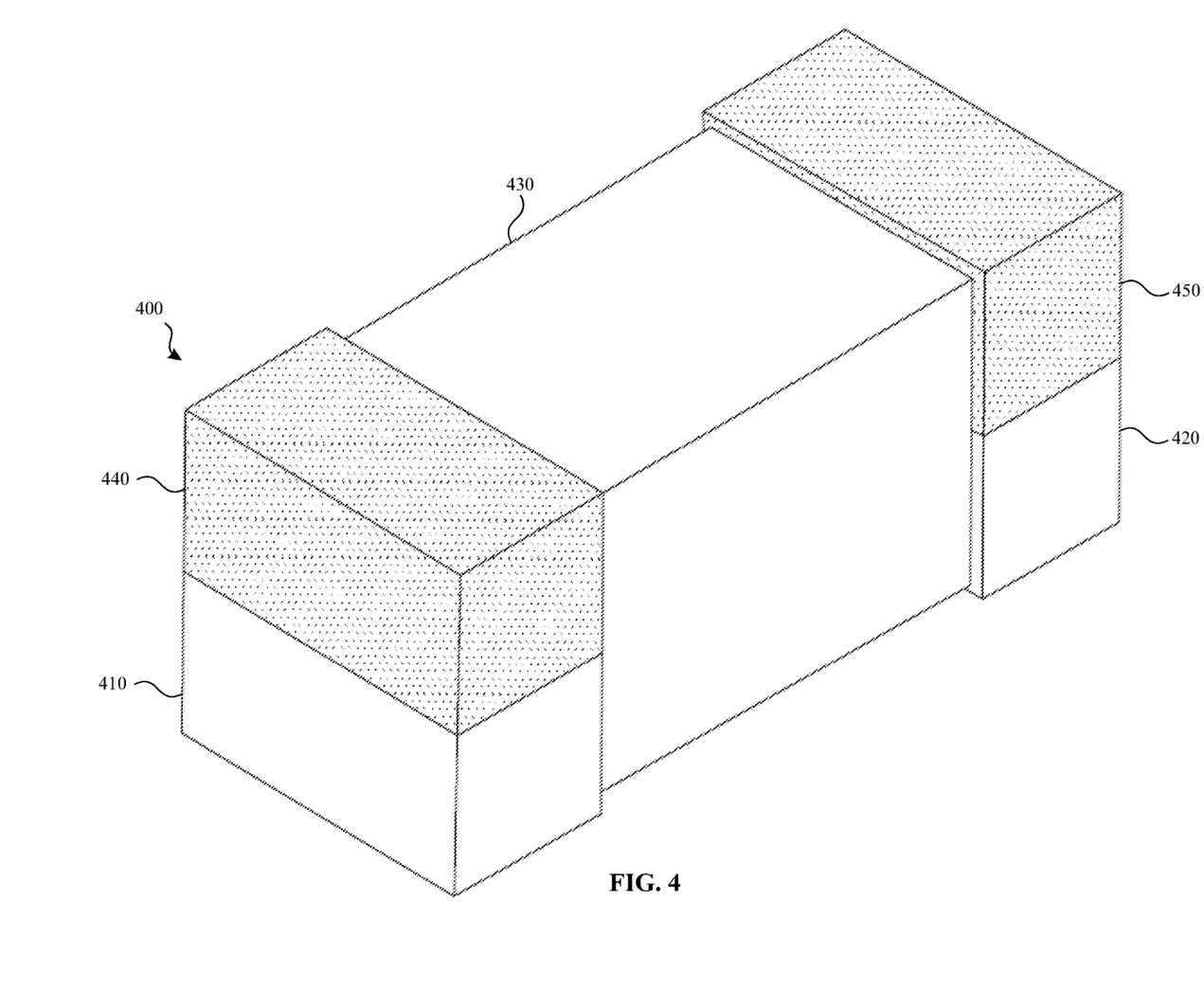
FIG. 4 illustrates a surface mount device having a first solder mask on a portion of a first contact and a second solder mask on a portion of a second contact according to an example.

FIG. 4 illustrates a surface mount device 400 having a first solder mask 440 on a portion of a first contact 410 and a second solder mask 450 on a portion of a second contact 420 according to an example. The surface mount device 400 may be similar to the surface mount device 100 shown and described with respect to FIG. 1. For example, the surface mount device 400 includes a first contact 410 on a first side of a dialectic 430 and a second contact 420 on a second side of the dialectic 430. However, unlike the surface mount device 100 of FIG. 1, the solder masks on each of the contacts of the surface mount device 400 cause the surface mount device 400 to be less susceptible to tombstoning.

In an example, a first solder mask 440 is provided on at least a portion (e.g., an upper or top portion) of an outer surface of the first contact 410. Likewise, a second solder mask 450 is provided on at least a portion (e.g., an upper or top portion) of an outer surface of the second contact 420. The first solder mask 440 and the second solder mask 450 change a roughness of the outer surface of each of the first contact 410 and the second contact 420. Although the solder mask is shown as being provided on an upper portion of each contact, the solder mask may be provided on multiple different locations or portions of the contact and/or may be provided on the entire surface of the contact.

The first solder mask 440 and the second solder mask 450 may be made from any suitable material such as, for example, a polymer. A thickness of the solder mask may range from approximately five micrometers to fifteen micrometers. Although a specific range has been given, the solder mask may have any thickness.

In an example, the first solder mask 440 covers an outer side surface of the first contact 410. The first solder mask 440 may also extend to a front outer surface of the first contact 410 and/or a back outer surface of the first contact 410. Likewise, the second solder mask 450 covers an outer side surface of the second contact 220. The second solder mask 450 may also extend to a front outer surface of the second contact 420 and/or to a back outer surface of the second contact 420.

The first contact 410 be coated with the first solder mask 440 during a manufacturing process (e.g., after a plating process has been completed). Likewise, second contact 420 may be coated with the second solder mask 450 during the same (or a different) manufacturing process. In another example, the contacts may be coated with a solder mask prior to being placed (either manually or electronically) on a printed circuit board.

Figure 5:
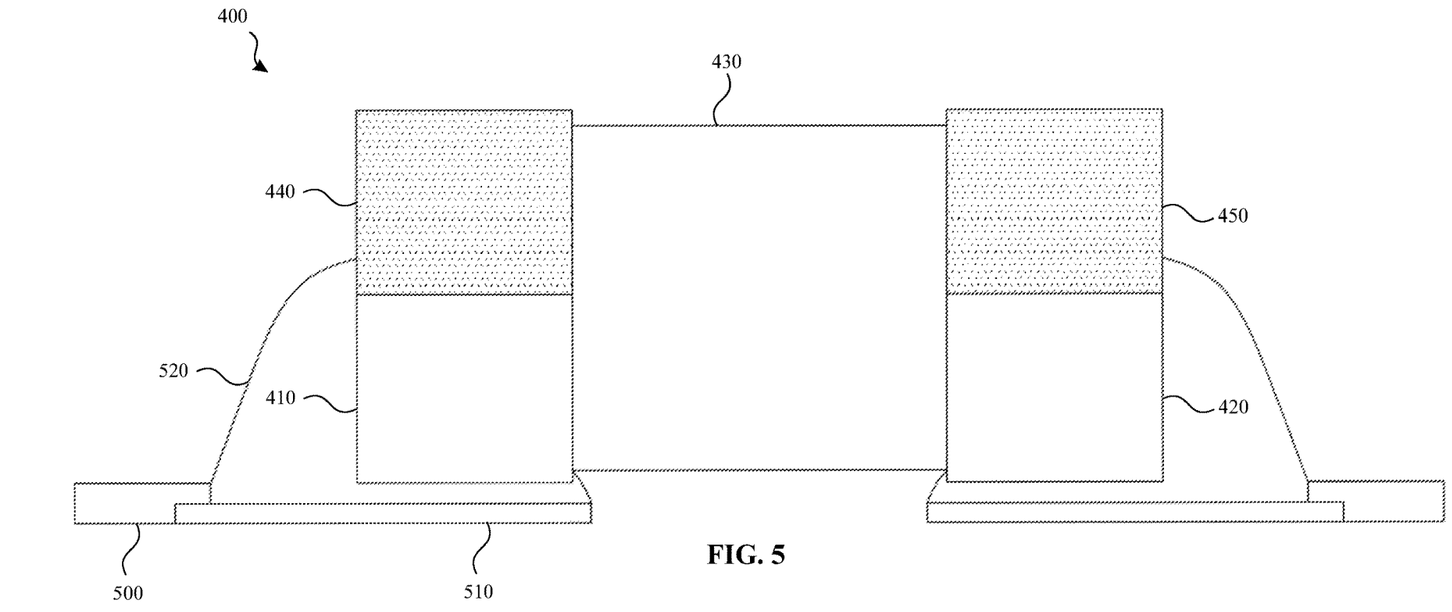
FIG. 5 illustrates how the first solder on the first contact and the second solder mask on the second contact prevent the surface mount device of FIG. 3 from tomb stoning like the surface mount device shown in FIG. 1 according to an example.

FIG. 5 illustrates how the first solder mask 440 on the first contact 410 and the second solder mask 450 on the second contact 420 prevent the surface mount device 400 of FIG. 4 from tombstoning like the surface mount device 100 shown in FIG. 1 according to an example.

In the example shown in FIG. 5, the surface mount device 400 may be placed on a pad 510 of a printed circuit board 500. The pad 510 may include solder paste 520. During a reflow soldering process, the first solder mask 440 and the second solder mask 450 help maintain a balance between a torque and/or surface tension provided on the first contact 410 with a torque and/or surface tension provided on the second contact 420 due to a wetting force associated with a reflow soldering process. Balancing or maintaining a balance between the torque on the first contact 410 and the second contact 420 helps prevent the first side of the of the surface mount device 400 (e.g., the side of the surface mount device 400 having the first contact 410) from lifting off of the pad 510 and/or the printed circuit board 500 and/or helps prevent the second side of the of the surface mount device 400 (e.g., the side of the surface mount device 400 having the second contact 420) from lifting off of the pad 510 and/or the printed circuit board 500.

In some examples, as the solder 520 moves up the side of the first contact 410 and/or the second contact 420 during a reflow soldering process, the first solder mask 440 and/or the second solder mask 450 prevents the solder from climbing further up the side (e.g., due to a change in the roughness of the outer surface of each contact) of the contact. Thus, even if the solder on different sides of the surface mount device 400 undergo a wetting process at different times, the first solder mask 440 and/or the second solder mask 450 prevent an upward movement or push (e.g., caused by solvent vapors from flux) of the solder 520 during the reflow soldering process. Since the solder 520 is prevented from moving up the side of the contact, the torque on each side of the surface mount device 400 may remain substantially balanced.

In some examples, a surface mount device may have both features described herein. For example, a surface mount device may have a channel and a solder mask. In such an example, the channel may define an upper portion of the contact and a lower portion of the contact and the solder mask may be provided on either the upper portion or the lower portion of the contact.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A surface mount device for a printed circuit board, comprising:
   a first contact provided on a first side of the surface mount device;
   a second contact provided on a second side of the surface mount device;
   a first channel defined by a planar first side of the first contact and extending across a width of the planar first side of the first contact, the first channel having a depth of at least ten micrometers and a width of at least thirty micrometers; and
   a second channel defined by a planar second side of the second contact and extending across a width of the planar second side of the second contact,
   the second channel having a depth of at least ten micrometers and a width of at least thirty micrometers;
   a first solder mask provided on an upper portion of the first contact; and
   a second solder mask provided on an upper portion of the second contact, the first solder mask and the second solder mask having a thickness of between five micrometers and fifteen micrometers,
   wherein the first channel and the second channel are adapted to prevent at least one of the first side of the surface mount device and the second side of the surface mount device from lifting off of the printed circuit board during a reflow soldering process.

2. The surface mount device of claim 1, wherein the first channel and the second channel are adapted to prevent the at least one of the first side of the surface mount device and the second side of the surface mount device from lifting off of the printed circuit board during the reflow soldering process by balancing a first torque on the first side of the surface mount device with a second torque on the second side of the surface mount device.

3. The surface mount device of claim 1, wherein the first channel and the second channel are adapted to prevent the at least one of the first side of the surface mount device and the second side of the surface mount device from lifting off of the printed circuit-board during the reflow soldering process by preventing an upward push of solder caused by solvent vapors during the reflow soldering process.

4. The surface mount device of claim 1, wherein:
   the first contact extends at least partially along a front side of the surface mount device and at least partially along a back side of the surface mount device;
   the first channel extends at least partially along the first contact on the front side of the surface mount device; and
   the first channel extends at least partially along the first contact on the back side of the surface mount device.

5. The surface mount device of claim 1, wherein:
   the second contact extends at least partially along a front side of the surface mount device and at least partially along a back side of the surface mount device;
   the second channel extends at least partially along the second contact on the front side of the surface mount device; and
   the second channel extends at least partially along the second contact on the back side of the surface mount device.

6. The surface mount device of claim 1, wherein the first channel defines the upper portion of the first contact and a lower portion of the first contact.

7. The surface mount device of claim 1, wherein the second channel defines the upper portion of the second contact and a lower portion of the second contact.

8. The surface mount device of claim 1, wherein the first channel is positioned at a midpoint of the first contact and the second channel is positioned at a midpoint of the second contact.

9. The surface mount device of claim 1, wherein the first channel is formed during a plating process.

10. The surface mount device of claim 1, wherein:
    the first contact extends at least partially along a front side of the surface mount device and at least partially along a back side of the surface mount device;
    the first solder mask extends at least partially along the upper portion of the first contact on the front side of the surface mount device; and
    the first solder mask extends at least partially along the upper portion of the first contact on the back side of the surface mount device.

11. The surface mount device of claim 1, wherein:
    the second contact extends at least partially along a front side of the surface mount device and at least partially along a back side of the surface mount device;
    the second solder mask extends at least partially along the upper portion of the second contact on the front side of the surface mount device; and
    the second solder mask extends at least partially along the upper portion of the second contact on the back side of the surface mount device.

12. The surface mount device of claim 1, wherein the first channel is positioned at a midpoint of the first contact and the second channel is formed at a midpoint of the second contact.

13. A surface mount device for a printed circuit board, comprising:
    a first contact at least partially enclosing a first side of the surface mount device;
    a second contact at least partially enclosing a second side of the surface mount device;
    a first channel defined by the first contact, the first channel extending horizontally across a first side of the first contact and extending horizontally across at least a portion of a front side of the first contact and a back side of the first contact, the first channel having a depth of at least ten micrometers and a width of at least thirty micrometers;
    a second channel defined by the second contact, the second channel extending horizontally across a first side of the second contact and extending horizontally across at least a portion of a front side of the second contact and a back side of the second contact, the second channel having a depth of at least ten micrometers and a width of at least thirty micrometers;
    a first solder mask provided on an upper portion of the first contact; and
    a second solder mask provided on an upper portion of the second contact, the first solder mask and the second solder mask having a thickness of between five micrometers and fifteen micrometers.

14. The surface mount device of claim 13, wherein the first channel and the second channel prevent the surface mount device from tombstoning by balancing a first torque on the first side of the surface mount device with a second torque on the second side of the surface mount device caused by surface tension of molten solder during a reflow soldering process.

15. The surface mount device of claim 13, wherein the first channel and the second channel prevent the surface mount device from tombstoning by preventing an upward push of solder caused by solvent vapors during the reflow soldering process.

16. The surface mount device of claim 13, wherein the first channel defines the upper portion of the first contact and a lower portion of the first contact.

17. The surface mount device of claim 13, wherein the second channel defines the upper portion of the second contact and a lower portion of the second contact.

18. A surface mount device for a printed circuit board, comprising:
  a first contact;
  a second contact;
  a first means continuously formed on a planar side surface, a planar front surface and a planar back surface the first contact, the first means having a depth of at least ten micrometers and a width of at least thirty micrometers;
  a second means continuously formed on a planar side surface, a planar front surface and a planar back surface of the second contact, the second means having a depth of at least ten micrometers and a width of at least thirty micrometers;
  a third means provided on an upper portion of the first contact; and
  a fourth means provided on an upper portion of the second contact, the third means and the fourth means having a thickness of between five micrometers and fifteen micrometers,
  wherein at least one of the first means and the second means is adapted to maintain a balance between a first torque provided on the first contact and a second torque provided on the second contact during a reflow soldering process.

19. The surface mount device of claim 18, wherein:
  the first means is a first channel etched into the first contact, the first channel extending horizontally across the planar side surface, the planar front surface and the planar back surface of the first contact; and
  the second means is a second channel etched into the second contact, the second channel extending horizontally across the planar side surface, the planar front surface and the planar back surface of the second contact.

20. The surface mount device of claim 18, wherein:
  the third means is a first solder mask provided on upper portion of the first contact; and
  the fourth means is a second solder mask provided on the upper portion of the second contact.

\* \* \* \* \*